United States Patent [19]

Bluzer et al.

[11] Patent Number: 4,672,645

[45] Date of Patent: * Jun. 9, 1987

[54] CHARGE TRANSFER DEVICE HAVING AN IMPROVED READ-OUT PORTION

[75] Inventors: Nathan Bluzer, Silver Spring; Donald R. Lampe, Ellicott City, both of Md.

[73] Assignee: Westinghouse Electric Corp., Pittsburgh, Pa.

[*] Notice: The portion of the term of this patent subsequent to Dec. 17, 2002 has been disclaimed.

[21] Appl. No.: 237,332

[22] Filed: Feb. 23, 1981

Related U.S. Application Data

[60] Division of Ser. No. 203,092, Nov. 3, 1980, Pat. No. 4,559,638, and a continuation of Ser. No. 953,808, Oct. 3, 1978, abandoned.

[51] Int. Cl.$^4$ .................. G11C 19/28; H01L 29/78
[52] U.S. Cl. .................................... 377/60; 357/24
[58] Field of Search ............... 357/24 M; 307/221 D; 377/57-63

[56] References Cited

U.S. PATENT DOCUMENTS

| | | | |
|---|---|---|---|
| 3,918,070 | 11/1975 | Shannon | 357/24 R |
| 4,074,302 | 2/1978 | Brewer | 357/24 M |
| 4,110,777 | 8/1978 | Esser et al. | 357/24 M |
| 4,132,903 | 1/1979 | Graham | 307/221 D |
| 4,152,715 | 5/1979 | Wang | 357/24 R |
| 4,247,788 | 1/1981 | Bluzer | 307/221 D |
| 4,559,638 | 12/1985 | Bluzer et al. | 357/24 |

FOREIGN PATENT DOCUMENTS 7506795 12/1976 Netherlands ................ 357/24 LR

OTHER PUBLICATIONS

Chamberlain, "High Speed Photoelement with Gain", IBM Technical Disclosure Bulletin, vol. 19 (4/77) pp. 4458-4460.

Primary Examiner—Gene M. Munson
Attorney, Agent, or Firm—W. G. Sutcliff

[57] ABSTRACT

A charge coupled device that includes an output portion having a field effect transistor disposed in the potential well channel to provide a non-destructive readout of the analog value of a charge pocket located in the portion of such potential well channel beneath the transistor. Drain, source and channel regions of the transistor are disposed transverse to the flow of charge pockets. The conductivity of the channel is modulated as a function of the value of a charge pocket in the potential well beneath the transistor.

11 Claims, 11 Drawing Figures

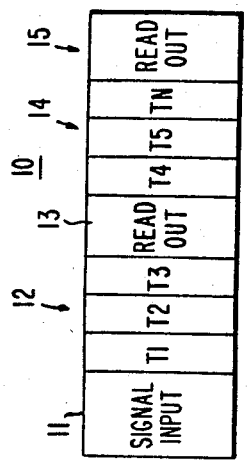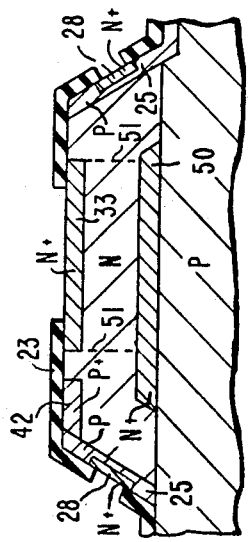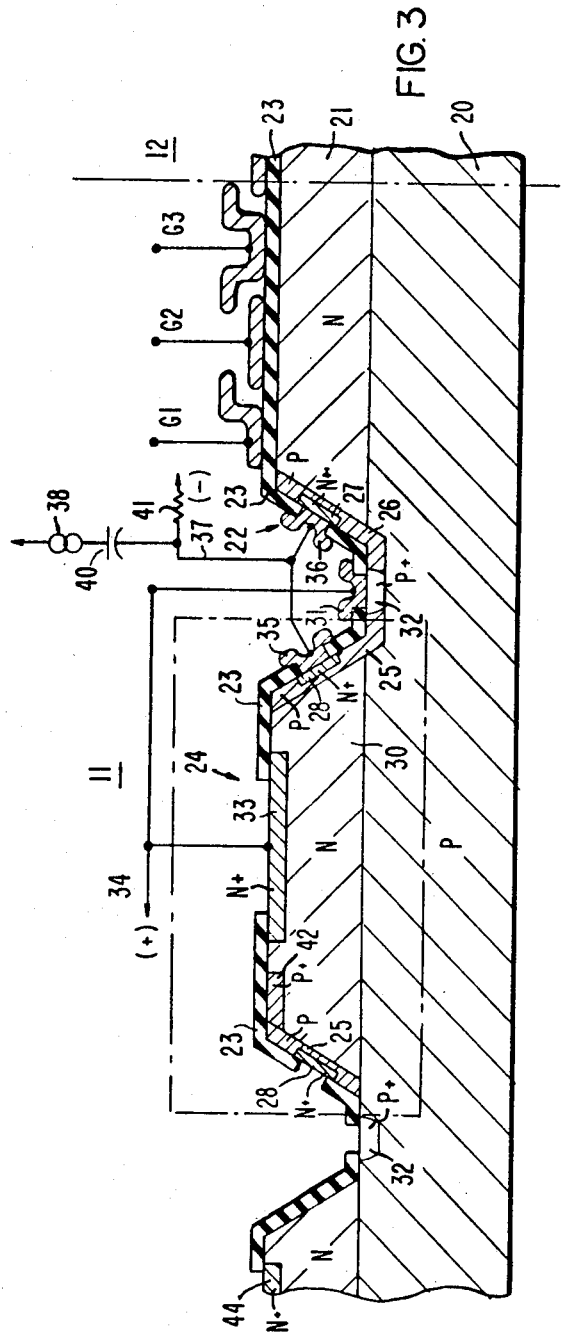

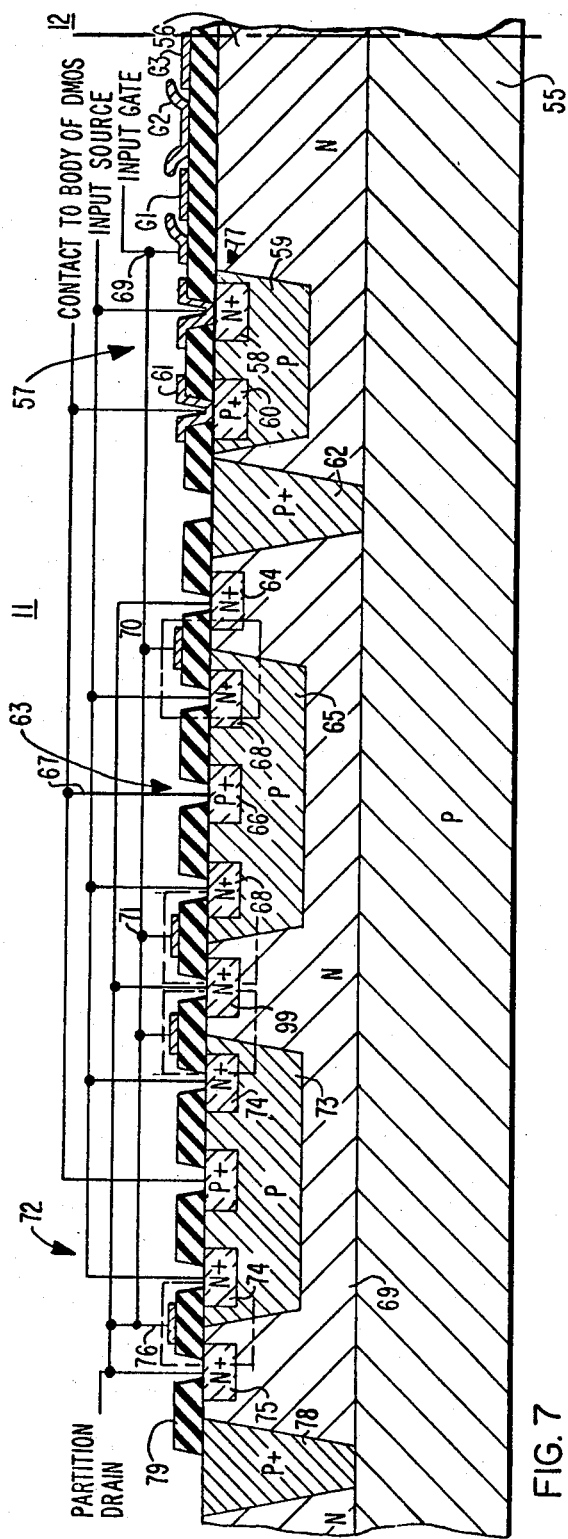
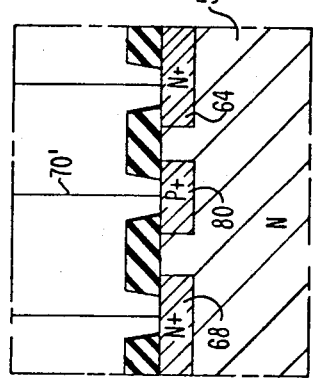
FIG. 7
FIG. 8

CHARGE TRANSFER DEVICE HAVING AN IMPROVED READ-OUT PORTION

CONTRACT CLAUSE

The Government has rights in this invention pursuant to Contract No. N00173-78-C-0212 with the Department of the Navy.

CROSS-REFERENCE TO RELATED APPLICATIONS

Reference is made to application Ser. No. 953,809 now U.S. Pat. No. 4,247,788, entitled Charge Transfer Device With Transistor Input Signal Divider with patent application Ser. No. 953,808, filed Oct. 3, 1978 now abandoned, of which this is a continuation. This application Ser. No. 237,332 is a division of application Ser. No. 203,092, filed Nov. 3, 1980 which issued as U.S. Pat. No. 4,559,638.

BACKGROUND OF THE INVENTION

Charge transfer devices may be thought of as having three functional portions; namely, a signal input portion, where a signal current is applied to the device for transforming such signal into a charge packet; a transfer portion, having a plurality of stages where the packet of charge or an accurate portion thereof is transferred from stage to stage; and a readout, output or sensing portion where the charge packet is converted to an electrical signal that is a representation of the charge packet. The operating frequency of charge transfer devices is usually limited by the operating speed of the input and output portions or structures.

Heretofore, several clocking operations or a single MOS transistor was utilized to meter the analog charge packets from the input portion into a transfer stage or potential well. The additional clocking operations limit the maximum information bandwidth of the device over the bandwidth possible wth an injection using a single operation. The use of an MOS single injection transistor, however, exhibits threshold non-uniformities and susceptibility to bandwidth reduction due to parasitic effects.

Inherently, charge transfer devices can accommodate only very low currents. Specifically, the current handing capability of a high-speed device is in the hundred microampere region; and generating such a low current level at high frequencies through high impedance lines is difficult and susceptible to induced noise currents by capacitance coupling and leakage currents enhanced by offset voltages. A higher level input signal applied to such input structure would exhibit better noise immunity than low level input signals. Such higher level input signals, however, are generally too great for charge transfer devices in that the potential wells become saturated with charge.

Thus, it is desirable to provide a signal input structure for a charge coupled device that enhances the input of high frequency signals and the signal to noise ratio of the input signal. The signal portion should involve only a sigle step without additional input clocking circits in order to maximize the bandwidth of the input signal. Also, it is desirable that the input signal level be sufficiently high to provide better noise immunity and that the current level be sufficiently low for metering of charge packets for coupling or injection into the transfer or shift register portion. Further, the input structure should have a low input impedance so that it is less susceptible to bandwidth reduction by parasitic capacitances.

Heretofore, with respect to the readout portion or structure, the charge transfer device utilized a floating gate amplifier and a reset switch, which required several clocking operations to form an electrical signal from a charge packet. The clocking operations required additional circuitry and reduced high-speed operation because the output circuit control signal bandwidth necessary for satisfactory operation was several times the output signal bandwidth to permit the several operations required to reconstruct the signal from the charge packet. Also, the noise associated with the wider bandwidth increased the noise contribution to the output signal.

Therefore, it is desirable to provide a readout portion or structure that can be either non-destructive or destructive with respect to the charge packets; and that does not require a reset switch or several clocking operations to form an electrical signal from a charge packet.

SUMMARY OF THE INVENTION

The present invention provides a charge transfer device having a readout portion disposed in the charge transfer device channel with means to sense the analog value or quantity of charge in the charge packet in the channel beneath the readout portion.

More specifically, in accordance with the present invention, a charge transfer device is provided having a readout portion incorporated into the charge packet channel which includes a field effect transistor having the width dimension of its drain, channel, and source regions, oriented transverse to the direction of charge flow; that is, each of the regions are either upstream or downstream of the other regions in the direction of charge flow.

Specifically, and in accordance with one embodiment of the present invention, the readout portion of the charge transfer device is comprised of a P-channel depletion-mode field effect transistor incorporated into the charge packet channel having it drain, channel, and source oriented transverse to the direction of charge flow. Channel stops limit the width of the sensing P-channel field effect transistor and confine the signal in the transfer stages to flow under the charge sensing field effect transistor. Charge flowing in the charge packet channel passes under the sensing field effect transistor and modulates the field effect transistor conductivity. Modulation is effected when the signal charge under the sensing field effect transistor modulates the depletion width at the P-N junction formed by the sensing field effect transistor and the charge transfer channel N-type epitaxial layer, thereby modulating the transistor channel thickness or conductivity. Modulation of the sensing field effect transistors conductivity by signal charge flowing in the charge packet channel is monotonic and does not consume the modulation signal charge packet. Such readout structure may be either non-destructive or destructive with respect to the charge packet in the channel.

In another aspect, the present invention comprises a charge transfer device having an improved input and readout portion separated by one or more tranfer stages wherein the potential well channel is common to both the signal input and readout portions of the device. The signal input portion includes a bipolar transistor having a collector portion adjacent to and forming part of the potential well channel. The base portion of such bipolar transistor includes means for applying a DC bias potential to the base thereof, and the emitter portion of the transistor has means for receiving the input signal for developing a charge packet into the channel. The readout portion is comprised of a P-channel depletion mode-field effect transistor with its drain, channel, and source oriented transverse to the direction of charge flow in the potential well channel. Charge flowing in the potential well channel passes under the sensing field effect transistor and modulates the trasistor's channel conductivity. Modulation of the transistor's conductivity by signal charge flowing in the charge packet channel is monotonic and does not consume the modulation signal charge packet.

BRIEF DESCRIPTION OF THE DRAWINGS

FIG. 1 is a block diagram illustrating the typical arrangement of the signal input, transfer gates, and readout structure which may be utilized in accordance with the present invention;

FIG. 3 is a sectional view taken at line III—III of FIG. 2 and looking in the direction of the arrows;

FIG. 6 is a fragmentary view of an alternate embodiment which can be substituted for that portion of FIG. 2 within the alternating long and short dashed lines thereof;

FIG. 7 is a sectional view similar to that shown in FIG. 2 except that it is constructed on a planar base surface with MOS type devices and illustrates in detail a typical connection of the various input transistors for typical operation;

FIG. 8 is a fragmentary view within the dashed lines of FIG. 7 to show still another embodiment of the present invention for such portion and all others similar thereto;

DESCRIPTION OF THE PREFERRED EMBODIMENTS

Figure 2:
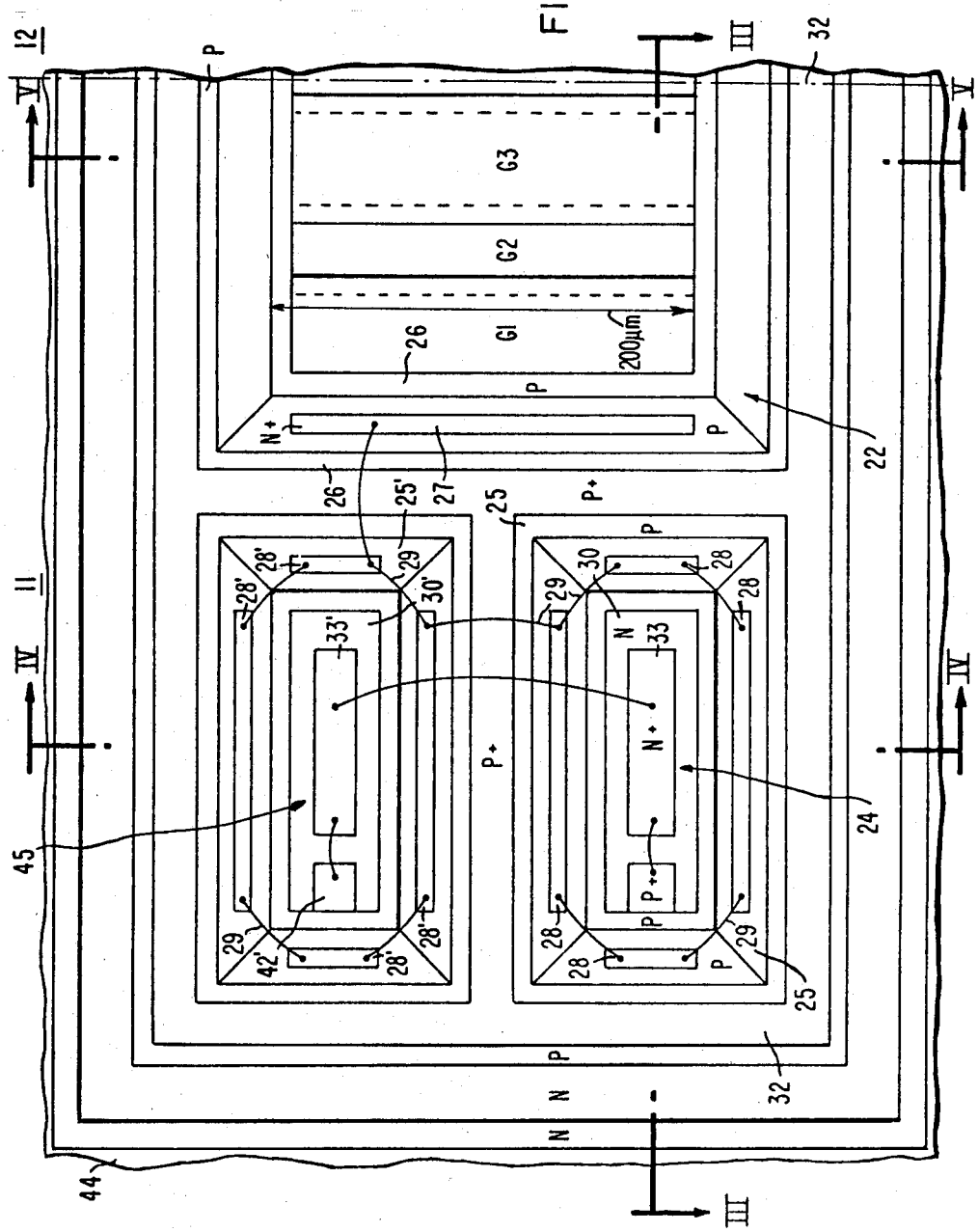
FIG. 2 is a fragmentary plan view of a charge coupled device to illustrate the input portion and second transfer gates to facilitate coupling between the input portion and the transfer stages in accordance with one embodiment of the present invention.

In utilizing the term "charge transfer device, hereinafter referred to as CTD, it is meant to include chargecoupled devices, (CCD), bucket brigade devices (BBD) and other devices that have input portions to form charge packets and read out the analog or digital values of such charge packets, except photosensitive devices, which of course, in many instances do not require an input portion. The term CCD as used herein is meant to include both the surface channel and the bulk channel type of devices. The term "surface channel" is meant to include those devices where the charges move between a semiconductor body and the overlying dielectric. In the bulk channel type of CCD, the term includes those devices where the charges move within the semiconductor body. The term "bulk channel" (CCD) is meant to include both those that have a shallow channel and a deep channel that is, greater than 1 micron. In the shallow channel devices, those included the CCD's referred to as "buried channel or bulk channel." The deep channel (CCD) devices include the type known as Peristaltic devices. It is contemplated, that the devices in accordance with the present invention will provide simplicity in structure and operate equally as well regardless of the particular type of CTD. However, the description of the present invention includes the bulk channel type of CCD; and more particularly, the CCD known as the Peristaltic type, which demonstrates highspeed characteristics. It is understood that the particular geometric structure of the present invention is also advantageous in the construction of any type of CCD, BBD, or other type of CTD; and the various CTD's described herein may be fabricated in a conventional manner utilizing known diffusion, implantation, and epitaxial techniques.

Referring to FIG. 1, a CCD generally referred to as 10, includes a signal input portion 11 for injecting and transforming the signal into a charge packet of a predetermined analog value; and also includes a charge transfer or shift register portion 12 which includes stages T1, T2, and T3 for storing and transferring such charge packet. The potential wells beneath gates referred to as G1, G2, and G3 (FIG. 3) are used to facilitate coupling between the transferring stage 12 and the input stage 11. A readout portion 13 is illustrated between the transferring stage T3 and stage T4 to illustrate the arrangement of the nondestructive readout portion 13 in accordance with the present invention. It is to be noted, that on the righthand side of the readout portion 13 as viewed in the drawing, there may be a transfer section 14 that continues to transfer the charge into subsequent transferring stages T4, T5, TN thereby utilizing the nondestructive readout capabilities of the present invention. Another readout portion 15 which is similar to that readout portion 13 may be provided adjacent the last transfer stage TN and may be utilized if desired as a destructive readout portion in accordance with the present invention. As previously mentioned, it is understood that the FIG. 1 may represent any type of device in accordance with the present invention that includes a readout portion and a charge transfer portion; or a charge transfer portion and a readout portion; or both the signal input portion, the transfer portion, and the readout portion or different combination of these to form a structure with several input and output portions.

Referring to FIGS. 2 and 3, the portion 11 of FIG. 1 is shown in detail. For purposes of illustration and clarity, the dielectric and the metallic connections have been omitted from the plan view of FIG. 2. These figures represent the input and a portion of the transfer structure that is manufactured according to what is termed an anisotropic etch wherein the etching of the substrate occurs at different rates to provide a nonplanar surface. Substrate 20 may be formed of any semiconductive material such as silicon or gallium arsenide, for example and be in the neighborhood of 13 mils thick. In the substrate 20 is a channel portion 21 which is doped with an N-type impurity, and may be anywhere from one to five microns deep to form the potential well channels beneath gates G1, G2, and G3, as well as the collector portion for a first or sometimes called injection transistor 22. The width of the potential wells, for a high speed peristaltic CCD may be in the order of 200 microns, for example. (See FIG. 1.) For a buried channel CTD such doping with the N-type impurity may be constant or uniform throughout. However, for a Peristaltic type device, the doping may not be constant but graded, and the density of the impurities increases towards the surface adjacent dielectric portion 23. A second transistor 24 which may be termed a partitioning transistor has a base 25 formed from a P-type impurity which is also common with a base portion 26 for the first transistor 22. The base 25 regions may be one to two microns thick for high speed operation. The transistors 22 and 24 each have an emitter portion 27 and 28 which may be approximately four microns wide and connected to each other by wires 29 as shown in FIG. 2. The collector portion of the first transistor 22 is in common with the channel portion 21; and the partitioning or mirror transistor 24 has a collector portion 30 formed of an N-type impurity which may be one to five microns thick, for example. In order to make ohmic contact with the metallic portion 31 in contact with the base material, a P+ region 32 is formed beneath the contact 31. Similarly, the collector portion 30 of the transistor 24 has an N+ portion 33 for ohmic contact with the connection 34. Emitter contacts 35 and 36 of the transistors 22 and 24 are connected by a line 37 to an AC signal source 38 through a capacitor 40 and to a DC source through resistor 41. The common base terminal 31 for the transistor 22 and 24 is connected to the collector 30 of the transistor 24 through line 34 to a DC potential that is more positive than the DC potential applied to the emitter terminals 35 and 36. A typical current that may be applied to the DC source through the resistor 41 may be 2 milliamps, for example. A doped region with a P-type impurity referred to at 42 is in contact with the common base portion 25 and serves to short the base to the collector portion of the transistor 24, which ensures that the base-emitter junction potential is generated by the current flowing through the partitioning transistor and is identical in both the such transistors 22 and 24. A leakage ring 44 formed of N+ doped material is formed to reduce the leakage current into the CTD wells from periphery of the entire CTD device.

The area of the emitter base junction of the transistor 22 is in a certain ratio to the area of the emitter base junction of the transistor 24. The current which is injected into the emitter contact at 37 is divided between the transistor 22 and 24 in accordance with the proportionate based emitter junction areas of the first transistor and one or more of the second transistors. In the event, that a large ratio is desired, that is, that the area of the emitter base junction of the partitioning transistors is substantially greater than a base emitter junction of the transistor 22, another partitioning transistor 45 (see FIG. 2) may be formed to provide the additional area. This transistor is similarly configured to the transistor 24 and includes emitter portion 28', base portion 25' in common with the base portion 26 of the transistor 22, a collector portion 30' and a portion 33' that is shorted to a P+ region 42 similar to the transistor 24. The emitter, base, and collector regions of the transistor 45 are connected to the emitter, base, and collector regions, respectively, of the transistor 24 which in effect increases the base emitter junction area thereby increasing the ratio between the second or partitioning transistors and the first or injection transistor. Although the plan view of the FIG. 2 illustrates two of the second or partition transistors 24 and 40, it is understood that only one of such transistors may be utilized or more than two may be utilized depending upon the desired ratio of the emitter base junctions to effect the proper fractional division of the input signal.

Figure 4:
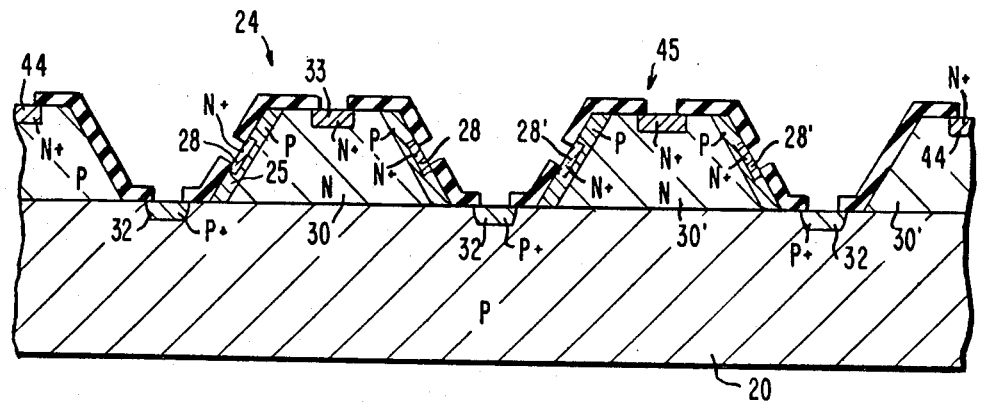
FIG. 4 is a sectional view taken at lines IV—IV of FIG. 2.
Figure 5:
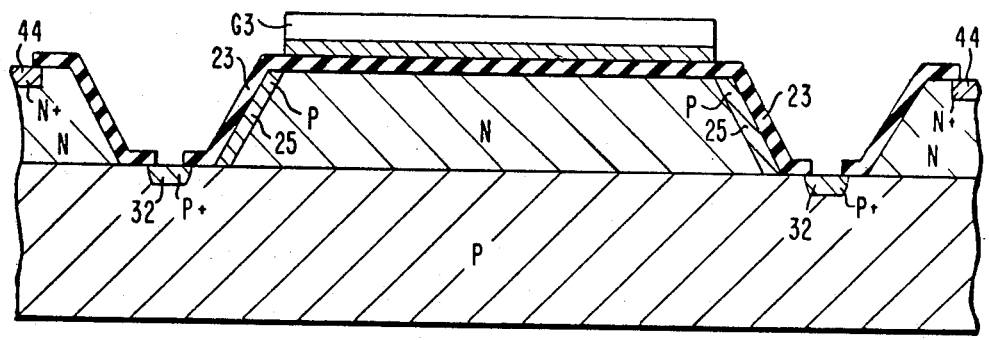
FIG. 5 is a sectional view taken at lines V—V of FIG. 2 and looking in the direction of the arrows.

Referring to FIGS. 4 and 5, which illustrates cross-sectional views as previously indicated and bear similar reference numerals, FIG. 4 illustrates also the isolation or channel stop 44 at opposite ends of each of the potential wells beneath the gates G1, G2 or G3 in order to confine the potential wells within the channel are provided. The gates G or the gates for the transfer stages T (FIG. 1) may be one micron thick, for example. The dielectric portion 23 (also FIG. 3) may be 0.1 of a micron thick, for example.

Referrig to FIG. 6, a fragmentary view of the second or partitioning transistor 24 is illustrated and corresponds to that portion of the input device within the dashed lines of FIG. 3. If desired, the transistor 24 may have a buried collector portion 50 doped with N+ impurities overlying the surface of the P substrate 20. Such buried collector is disposed beneath the N+ collector portion 33 and may be forty microns wide, for example, as viewed in FIG. 6; and if desired, may be extended in depth to merge with the N+ portion 33 as noted by the dashed lines 51. This arrangement of FIG. 6 decreases the collector resistance and improves the frequency response.

FIG. 7, is essentially the same device as described in connection with FIGS. 1 through 6, except that it is fabricated in a planar sense. In this embodiment as in the previously described embodiments the device has a semiconductor base which may be silicon or gallium arsenide that is doped with a P-type impurity and referred to as 55, the potential well channel region is doped with an N-type impurity and referred to as 56. Within the channel, is a first MOS transistor 57 that has a source of N+ type impurity 58 and a body 59 of a P-type impurity. The body 59 has a P+ impurity diffusion region 60 for facilitating ohmic contact with its metallic connector 61. A P+ impurity portion 62 is utilized for isolating the transistor 57 from a partitioning transistor 63. The transistors 57 and 63 may be MOS transistors that are known conventionally as double diffused MOS transistors where more than one dopant is diffused in the same region. The partitioning transistor 63 has an input source of N+ impurity 68 and body portion of P-type impurity 65. A P+ impurity 66 is utilized to make ohmic contact with a line 67. The transistor 63 also has a drain portion of N+ impurity 64 which constitutes the drain of such transistor. Each of the transistors has a gate portion that are commonly connected similar to the common base portion of the previously described bipolar transistors. The gate node for the transistor 57 is referred to at 69 while the gate nodes for the transistor 63 are referred to at 70. Both of the gate nodes are tied together similar to the bases in connection with the description of FIGS. 1 through 5 to form a single node similar to the bipolar embodiment. Similarly, all of the sources of the transistors 57 and 63 which serve the same function as the emitters described in connection with the previous embodiment, the drain of the transistor 57 is in common with the channel portion 56 similar to the previous embodiment, while the drain portions of the transistor 63 are connected and in turn tied to gate portion 71, 70 of the transistor 63. The fractional division of the input current between the first transistor 57 and the second or partitioning transistor 63 is determined by the ratio of the width of the channels in the body of the first transistors 57 and the respective second transistors 63 and 72. The width of the channel is that dimension which is orthogonal to the plane of the surface of the drawing, or in other words goes through the paper. The length of the channel is that dimension between the source and drain of each respective transistor. Although the bottom of the P-type body 59, 65 of the transistors 57, 63 are shown spaced from the P-type base 55 in the N channel 56, the operation of the device does not appear to be adversely effected if such body 59 or 65 were extended to actual contact with the P portion of the base 55. The dimensions of the various layers may be similar to those described in connection with FIGS. 2 through 5.

Similar to the embodiment described in connection with FIGS. 2 through 6, another partitioning transistors such as 72 may be utilized to obtain a greater ratio of transistor channel width in order to direct a smaller fractional portion of the input current into the potential well. This transistor 72 has a body portion of P-type impurity 73, a source of N+ impurity 74, and a drain portion 99 which is in common with the drain portion 64 of the transistor 63, and is an only contact through an N+ impurity 75. The transistor 72 has a gate portion 76 which is tied to the gate portions of all the other transistors 57 and 63 and to the drain portions 64, 99 and 75 through the N+ impurity regions 64', 75 and 99 of the partitioning transistors 63 and 72. The width of the body portion 59 of the transistor 57 adjacent the potential well beneath the gate G1, which is narrow relative to the other dimensions and referred to as that dimension between arrows 77 in order that the charge will travel in a rapid manner toward the potential well beneath the gate G1. P+ portion 78 is an isolation region and crosshatched portions 79 and 62 represents insulation overlaying the body of the device with appropriate windows for connection thereto. It is understood that although FIG. 7 shows a planar type of construction with an MOS transistor configuration for the input structure in accordance with one embodiment of the present invention, it is understood, that such planar fabrication may be utilized with the bipolar transistor embodiment described in connection with FIGS. 2 through 6. Although FIG. 7 illustrates the input structure with double diffused MOS transistor, however, conventional MOS transistors can also be used.

Referring to FIG. 8, a fragmentary representation of that portion of the device within the alternately long and short dashed lines of FIG. 7 may be replaced with junction type field effect transistors. In this modification, the only difference is that the MOS gate portions such as 70 of FIG. 7 is in direct junction contact with a P+ impurity region 80; such gate portion being referred to as 70' in FIG. 8. The N+ regions referred to at 68 and 64 are merely representative of the N+ nodes within the other dashed lines of FIG. 7.

The incorporation of the partitioning transistor of transistors of the FIGS. 2 through 6, and 7 and 8 into the input structure overcomes the problem of interfacing such input structure with the external current sources. The relationship between the current in one or more of the second partitioning transistors, depending on how many are utilized, to the current in the first or injection transistor, is proportional to the base emitter junction areas of such transistors in the case of bipolar and the width of the channel in the case of the MOS as previously mentioned because the base emitter or gate source voltages are equal for both the first and second transistors. The common base lateral transistor and its partitioning transistor or in the case of MOS transistors the common gate may be fabricated by employing double diffused techniques as previously mentioned to obtain the very narrow base width of less than 1 micron. The base width 77 as mentioned in connection with FIG. 7 will be smallest next to the virtual collector (bi-polar) or drain portion (MOS) producing a condition where the current injected into the emitter or source will preferably enter the collector or drain portion by way of the narrow base region 77. A bias on the first gate G1 produces a virtual collector thereby achieving an input structure where the collector of the bipolar transistor or the drain of a MOS is part of the potential well channel. Such a configuration results in a higher injection speed because the transport time of charge across the collector or drain is eliminated by making such collector or drain, the first CTD potential holding well. The gate G2, and/or G3 may be used as an injection gate or can be connected to one of the potential well transfer or shift register clocks with a two phase or a one and a half phase clocking format as is well known in the art. The amount of charge injected into the virtual collector's holding well depends on the value of the input current that is directed into such well and the integration or clock well time. It is preferred to apply the input signal by applying a dc voltage via the resistor 41 to the emitter nodes and a modulating ac current signal through capacitor 40 as described in connection with FIGS. 2 and 3. The injected current is then divided between the first transistor and one or more of the second or partitioning transistors. The precise current division that takes place achieves two principal advantages; namely, reduction of the deleterious bandwidth effects caused by parasitic capacitance and reduction of the coupling difficulty between the CTD and an input signal source. Since the input structure acts as a current divider; a low input current into the charge transfer device can be maintained even though a higher input current is injected by applying a higher input signal through a smaller series impedance, thereby achieving a wider input bandwidth. Typically, base emitter junction area (for the bipolar transistor embodiment) can be made smaller than 100 $\mu$m by 4 $\mu$m, while the junction area of the partitioning transistor or transistors can be made 400 $\mu$m by 16 $\mu$m, resulting in a current attenuation of 16:1. The effect of the partitioning transistor or transistors is to reduce the input impedance at the emitter node and reduce the effect of parasitic capacitances. Hence, for a 1 kilohm series resistor with a parasitic capacitance less than 1.5 picofarads, a 100 megahertz input bandwidth, an input signal levels less than 260 millivolts can be achieved.

Although, in accordance with the present invention, it is contemplated that the input portion of the CTC may be comprised solely of the first bipolar transistor with its collector or drain forming a part of the channel of the first potential well, the utilization of the partitioning transistor or transistors as previously described makes possible for a wider signal input bandwidth as compared to the input structure with just the single bipolar transistor. For example, if the operating speed for a common base bipolar transistor with the partitioning transistor according to the present invention is calculated, such operating speed is determined by three regions; namely the emitter frequency response, the base transit time and the collector transit time. The emitter frequency response represents the speed with which the emitter base voltage can change to accommodate a changing input current signal.

A simple expression for the emitter frequency response ($f_e$) is the input transconductance ($g_m$) divided by the total capacitance ($C_T$) at the emitter node times $2\pi$, i.e., $f_c = g_m/2\pi C_T$. Capacitance $C_T$ is the sum of: the emitter-base junction capacitance of the bipolar input transistor ($C_B$) and its mirror or partition ($C_M$) and parasitic capacitance $C_P$. It should be noted that capacitance $C_M$ and $C_B$ are proportional to each other (as the currents flowing respectively through the partitioning transistor and the bipolar input transistor) by the emitter-base junction areas. Without loss of generality assume a proportionality constant determined by the ratio of the junction area to be 25. Hence, the CCD input current $I_{CCD}$ will be 25 times smaller than the partition current $I_M$. Substituting for $g_m$ and $C_T$ we obtain the following expression:

$$\frac{1 + I_M/I_{CCD}}{\frac{C_P}{C_B} + \frac{C_M}{C_B} + 1}.$$

Clearly, the effect of the parasitic capacitance ($C_P$) on the input bandwidth at the emitter node is reduced twenty-six fold, a number equal to the current division of the input signal by the bipolar input structure. Hence, for a 10 $\mu$A CCD input current, an emitter area of 10$\mu$m by 10 $\mu$m, base doped with $10^{16}$ Boron atoms/cm$^3$ and emitter concentration higher than $10^{18}$ Arsenic atoms/cm$^3$ we obtain for emitter frequency response $f_c = 1.14 \times 10^9$ Hz. The large frequency response is due primarily to a twenty-six fold reduction of the parasitic capacitance. If the parasitic capacitance were not reduced, the emitter operating frequency response would be equal to $1.53 \times 10^8$ Hz. Therefore, the equivalent transit time for the emitter region is $0.88 \times 10^{-9}$ sec. Using the diffusion equation, we calculate the base transit time, $t_B = 2W^2/2.43D_B$, for a 1 $\mu$m wide base (W) and 21 cm$^2$/sec for the diffusion constant ($D_B$), we obtain a $1.25 \times 10^{-9}$ sec transit time across the base. Continuing the calculation for the transit time across a 5 $\mu$m virtual collector, $t_c = \pi L_C/v_s$, we obtain $2.6 \times 10^{-10}$ sec as the minimum time required to transport electrons across the collector, with a saturation velocity of $6 \times 10^6$ cm/sec for electrons. Summing all the transit times (emitter, base and collector) we obtain a 418 MHz input frequency response for the bipolar partition input circuit. Clearly, the input signal injection frequency limitation is greater than 100 MHz and is limited by the series input resistor and its shunting resistor can be reduced thereby, achieving further improvements in the CTD injection bandwidth.

Figure 9:
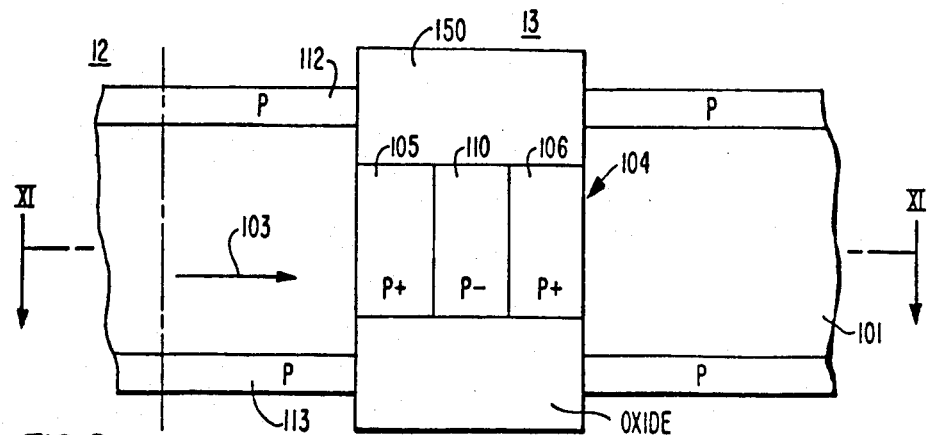
FIG. 9 is a fragmentary plan view of a charge transfer device according to one embodiment of the invention to illustrate the readout portion of such device.
Figure 10:
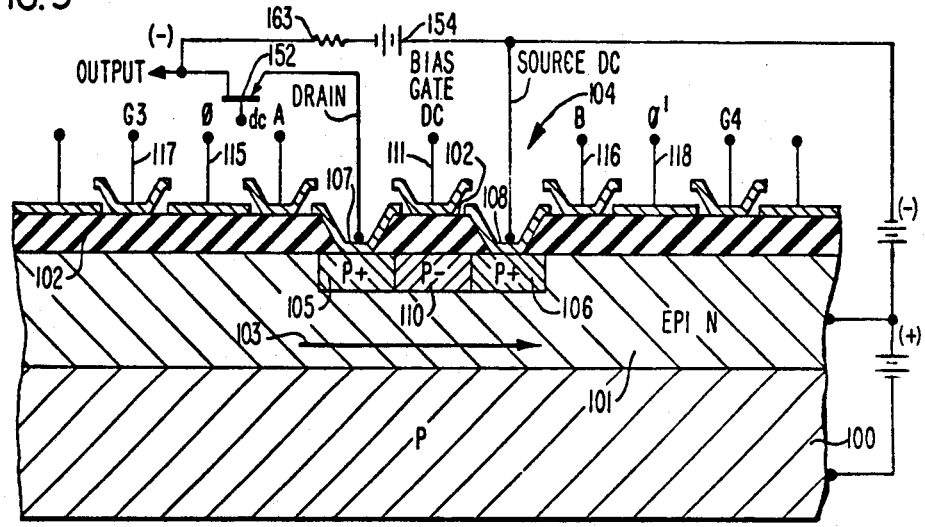
FIG. 10 is a sectional view of the portion of the device of FIG. 9 taken on line XI—XI and looking in the direction of the arrows.
Figure 11:
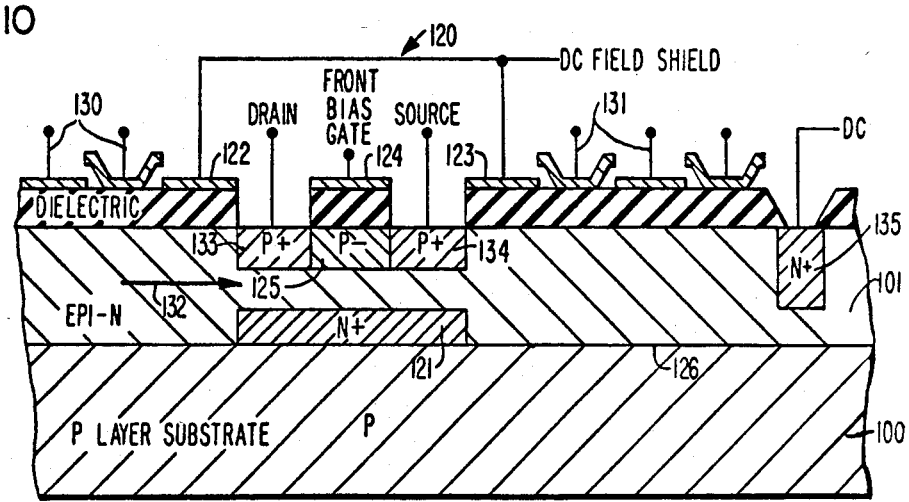
FIG. 11 illustrates an alternate embodiment of the portion of the charge transfer device of FIGS. 9 and 10.

Referring to FIGS. 9 and 10, the fragmentary views illustrate that portion of the CTD structure which includes the read-out portion 13 and the adjacent transfer stages 12. Similar to the input portion and the transfer stage, the output portion of the device has a substrate 100 that may be made of silicon or gallium arsenide, for example or be of the same depth or thickness. Overlaying the substrate portion 100 is a channel portion 101 in which the potential wells of the transfer portion of the device and the read-out portion reside. The channel 101 is an N-type material that may be diffused or ion implanted into the base structure in a conventional well-known manner. Similar to the other portions of the device, the channel 101 may be in the order of from 1 micron to about 5 microns in thickness. Overlaying the channel portion 101 is a dielectric material referred to as 102 that is similar in thickness to the previously described portions of the device. As previously mentioned, the portion of the channel beneath the gates G3 and G4 as shown in FIG. 10, each constitute a potential well. The direction of flow of the charge packets is indicated by an arrow 103. Intermediate the transfer stages containing gates G3 and G4 is located the read out portion when used in a nondestructive manner. For a destructive application of the read out portion, the charge is drained into the DC node, as shown in FIG. 11 through the N+ diffusion 135. The transistor 104 has a drain portion 105 constituted by P+ material one micron or less in thickness that is diffused or otherwise embedded into the N channel 101. The transistor 104 has a source portion 106 that is also formed of a P+ material. Conductive portions 107 and 108 provide for connection to an appropriate external circuit. Intermediate the source and drain portions 105 and 106 is a channel portion 110 that is comprised of a P− type impurity which may be diffused or otherwise doped into the N channel 101. Although unnecessary for the proper operation of the present invention under certain circumstances, it is preferable to maintain the depths of the source and drain and channel regions 105, 106, and 110, respectively, to be approximately the same, in order that the potential profile of the charge may be tailored in such a way as to promote the transfer of charge from beneath the read-out transistor to the next transfer stage once the read-out has occurred. For a nondestructive read-out, it is also preferable to locate the transistor within the channel 101 such that the drain portion 105 is adjacent the direction from which the charge packets flow while the source portion 106 which is separated by the channel 110 is positioned away from the direction from which the charge packets flow. This again is to profile the potential well in which the charge packet resides during read-out. This is done to promote the charge transfer out of the read-out well beneath the transistor 104 into the subsequent stage such as T4, for example, (see FIG. 1) for subsequent transfer or subsequent read-out as the case may be. The length or distance of each of the P+ regions in the direction of flow of the charge packets may be in the order of 5 microns, for example. Conductive terminal 111 overlies the dielectric material 102 for connection to a DC bias. Beneath oxide rectangles 150 and 181 of FIG. 9 on opposite sides of the P+ regions 105, 110, 106, the N material of the channel 101 is removed. Channel stops 112 and 113 which are diffused or otherwise implanted into the N region 101 at opposite sides of such channel serve to define the CTD channel width and the width of the sensing portion of the channel beneath the transistor 104 to confine the charge packet to flow beneath the charge sensing field effect transistor 104. It is apparent from FIGS. 9 and 10 that the drain, channel, and source 105, 110 and 106 are oriented transverse to the direction of charge flow. Charge flowing in the channel 101 beneath the transistor 104 modulates the conductivity of the channel 110. Modulation is effected when the signal charge beneath the transistor 104 modulates the depletion width at the PN junction formed by the sensing field effect transistor 104 and the N type epi bias of 101, thereby modulating the conductivity of the transistor or in other words, the channel width. Modulation of the transistor's conductivity by the signal charge flowing in the channel 101 is monotonic and does not consume the modulation signal charge packet. The modulating signal charge is transported under the sensing field effect transistor 104 by clock pulses.

A typical circuit for sensing the modulation of the channel 110 may be the conventional cascade circuit, which includes a bipolar transistor connected to the drain terminal of transistor 104 and a collector thereof connected through a resistor 153 to a negative potential. The base of the transistor is connected to a DC source more positive than the collector. The source 108 is connected to a power supply 154 and the channel 101 and base 100 as shown.

Referring again to FIG. 10, two types are gates are adjacent each side of the transistor 104. The gates directly adjacent the transistor 104 are referred to as A and B. These gates A and B may be used to shield the sensing transistor 104 from the clock pulses applied to the clocking gates referred to at 117 and 118, respectively. The blocking gate 115 and 116 are also used to adjust the DC potential of the channel 101 to facilitate charge transport to and from the region located below the sensing transistor 104. The AC clocking gate 115 which precedes the gate A in the direction of charge flow pushes the signal charge under the sensing transistor 104 while a succeeding gate B if pulsed, or 118, if gate B is not pulsed blocks the charge, thereby confining the charge under the transistor 104 in the channel 101. The charge injected under the field effect transistor 104 modulates the conductivity of the channel 110 to form an output signal dependent on the analog value of the charge packet therebeneath. Charge is removed from under the transistor 104 when the blocking gate 116 is pulsed attractive and the preceding gate 115 is maintained in the blocking state. After the signal charge is removed, the gate 116 is returned into the blocking state and the gate 115 is opened to let the next analog packet of charge into the sensing well under the transistor 104. Injection and removal of the signal charge from the sensing well is achieved at high speed because the DC bias on the gate 111 and the drain and source nodes of the read out transistor 104 produces a drift field to move the charge from under gate 115 to under gate 116. Also, the fringing fields induced by the voltage applied to the gates 115 and 116 augment the transport of charge into and out of the sensing well beneath the transistor in the channel 101. Minimal noise, if any, is associated with this arrangement for their is minimal capacitance to charge and discharge as compared to conventional read-out structures. With the exception of bulk trapping centers, the charge transport into and out of the sensing well is complete. Any noise associated with the transistor 104 may be reduced by increasing the quiescent current flowing in the channel, thereby increasing the transconductance and reducing the noise value and sensitivity of the field effect transistor 104.

Referring to FIG. 11, an N channel peristaltic CTD is shown that is similar to that described in connection with FIGS. 9 and 10 with the exception that it utilizes a field effect transistor referred to at 120 having a floating region 121 made of N+ type semiconductor material in the channel 101. Also, on opposite sides of the transistor 120 is are terminals 122 and 123 capable of providing a DC field shield. Thus, the built-in field effect transistor 120 has a MOS type front bias gate referred to as 124 and the region 121. With the front gate 124, the amount of DC current flowing in its channel 125 can be controlled. The operating level of the N+ diffusion floating region 121 can be established by adjusting the DC potential on the read out transistor regions 133, 125, 134 of the transistor 120 and the back bias voltage across the epi-substrate junction referred to at 126. Since the region 121 is in the potential well channel, any charge flowing in the channel 101 will inherently move across it and thereby change its potential relative to the substrate and the channel 125 of the transistor 120. Any change in the N+ region 121 potential modulates the current in the channel 125 thereby sensing the amount of charge residing in the region 121. Charge may be deposited in and removed from the N+ region 121 by applying clock voltages to the gates referred to at 130, 131, 122 and 123 respectively. Alternatively, when a DC potential is maintained on field shield gates, such as 122 and 123, clocking transients applied to the gates 130 and 131 are significantly decoupled from the transistor 120 resulting in a clearer signal. Reset of the floating region 121 is achieved automatically when the signal charge is removed by suitably pulsing the clocking gate in the direction of charge flow 132, 131 following the transistor 120. Similarly, charge is placed in the floating region 121 by the clocking gates 130 preceding the transistor 120 in the direction from which charge flow occurs as indicated by arrow 132. The orientation of the P+ regions 133 and 134 representing the source and drain regions, as well as the channel 125 are oriented in the same manner as the corresponding regions 105, 106, and 110 for the transistor 104 described in connection with FIGS. 9 and 10. The area of the floating region 121 is preferably coextensive with the total area of the P+, P−, and P+ regions 133, 125, and 134, respectively of the transistor 120.

The width of the channel 125 is that width which is in a direction from top to bottom as viewed in FIG. 9. For the arrangement described in connection with FIG. 11, where 121 is included, the orientation of the source and drain regions may be reversed with respect to the direction of flow of the charge packets. Although the inclusion of the N+ subdiffusion 121 may decrease the speed of operation, although it would tend to result in a more linear sensing of the charge in the potential wells. If desired, an N+ diffusion or other implantation referred to at 135 may be incorporated into the channel in the appropriate position with a DC voltage applied for destroying the charge packet after read-out. Such an arrangement may also be utilized in connection with the embodiment shown in FIGS. 9 and 10 if desired. It is also to be understood that the clocking arrangement illustrated in connection with FIGS. 9 and 10 may be utilized with the field effect transistor 120 and the floating region 121. Also, the circuit for sensing the modulation may be similar to that shown in FIG. 10.

Although there are various types of semiconductor material, the dopants are specifically shown for particular polarity, it is understood that such polarities may be reversed.

What is claimed is:

1. A charge transfer device for transferring charge packets in a predetermined direction from one potential well to an adjacent potential well and for sensing the value of the charge packet, said device comprising:
    a body of semiconductor material of one conductivity type;
    a potential well channel of semiconductor material of the opposite conductivity type overlying and forming an elongated junction with said body;

a field effect sensing transistor having source and drain regions of a conductivity type opposite that of the potential well channel disposed in said potential well channel, said field effect transistor also including a sensing channel region positioned between the drain and source regions, said regions being disposed serially in said predetermined direction of charge transfer; said channel being uniformly doped in that portion beneath said regions to said junction; and means including the source and drain regions to sense modulating the conductivity of the sensing transistor in response to the charge packets in the potential well channel.

2. A device according to claim 1 wherein the sensing transistor source and drain regions are of substantially similar depth.

3. A device according to claim 1 wherein the transistor is a depletion mode transistor.

4. A device according to claim 1 wherein the drain region is positioned upstream of the other regions in the direction from which the charge packets are transferred.

5. A device according to claim 1 further comprising clocking gate electrodes disposed at opposite sides of the transistor to transfer the charge packets from a potential well at one side of the transistor to the portion of the potential well channel beneath the transistor.

6. A device according to claim 5 further comprising shielding gate electrodes disposed adjacent opposite sides of the transistor interior of the clocking gates to decouple the transistor from the effects of the clocking gate electrodes.

7. A device according to claim 1 wherein the sensing channel region is of the same conductivity type as the source and drain regions, but less heavily doped.

8. A device according to claim 7 wherein the sensing channel region and the source and drain regions of the sensing transistor are all of substantially similar depth.

9. A charge transfer device having an input portion for converting a signal to a charge packet, a transfer region for transferring a charge packet from one potential well to another in a predetermined direction from the input portion, and a read-out portion for sensing the value of each packet of charge, comprising:

a body having a substrate of semiconductor material of one conductivity type and a potential well channel of semiconductor material of the opposite conductivity type overlying and forming an elongated junction with the substrate, said potential well chanel having a plurality of serially arranged gate electrodes intermediate its ends to define a plurality of individual potential wells for transfer of a charge packet from one to the other in said predetermined direction from the input portion, an injection transistor disposed adjacent one end of the potential well channel having emitter, base and collector regions, means for applying an input signal to the emitter region, said collector region being common to the potential well channel, for metering the input signal to form a charge packet in the potential well;

a field effect sensing transistor positioned in the potential well channel spaced from the input portion in said direction of charge transfer adjacent a predetermined one of the individual potential wells, said sensing transistor having spaced source and drain regions of said one conductivity type disposed serially relative to each other in said direction of charge transfer in the potential well channel, said sensing transistor also having a sensing channel region disposed between said spaced source and drain regions; and means coupled to the source and drain regions to sense modulation of the conductivity of the transistor as a function of the analog value of the charge packet in the potential well channel beneath the sensing transistor, said channel portion beneath said sensing transistor to the junction being uniformly doped.

10. A device according to claim 9 wherein the sensing channel region is of the same conductivity type as the source and drain regions of the sensing transistor, but less heavily doped.

11. A device according to claim 9 wherein the sensing transistor source and drain regions are of substantially similar depth.

* * * * *